US010825848B2

(12) United States Patent
Verbugt et al.

(10) Patent No.: US 10,825,848 B2
(45) Date of Patent: Nov. 3, 2020

(54) IMAGE SENSOR AND A METHOD TO MANUFACTURE THEREOF

(71) Applicants: Teledyne DALSA B.V., AE Eindhoven (NL); Teledyne DALSA, Inc., Waterloo (CA)

(72) Inventors: Daniel Verbugt, Helden (NL); Bryan Delodder, Guelph (CA)

(73) Assignee: TELEDYNE DIGITAL IMAGING, INC, Toronto (CA)

(*) Notice: Subject to any disclaimer, the term of this patent is extended or adjusted under 35 U.S.C. 154(b) by 0 days.

(21) Appl. No.: 14/851,943

(22) Filed: Sep. 11, 2015

(65) Prior Publication Data

US 2017/0077152 A1    Mar. 16, 2017

(51) Int. Cl.
*H01L 27/146* (2006.01)
(52) U.S. Cl.
CPC ...... *H01L 27/1461* (2013.01); *H01L 27/1463* (2013.01); *H01L 27/1464* (2013.01);
(Continued)
(58) Field of Classification Search
CPC .......... H01L 27/1461; H01L 27/14607; H01L 27/14636; H01L 27/14658;
(Continued)

(56) References Cited

U.S. PATENT DOCUMENTS 6,169,287 B1 * 1/2001 Warburton ............ G01T 1/2928
250/370.09

2002/0066860 A1 * 6/2002 Possin ............... H01L 27/14603
250/370.08

(Continued)

FOREIGN PATENT DOCUMENTS

| DE | 10 2012 202 500 A1 | 8/2013 |
|---|---|---|
| EP | 0 853 427 A2 | 7/1998 |
| EP | 2 305 119 A1 | 4/2011 |

OTHER PUBLICATIONS

Partial European Search Report dated Jan. 26, 2017, issued in related co-pending EP16185700.8.
(Continued)

*Primary Examiner* — David P Porta
*Assistant Examiner* — Shun Lee
(74) *Attorney, Agent, or Firm* — McGuireWoods LLP

(57) ABSTRACT

The disclosed embodiments include an image sensor and a method to manufacture thereof. In one embodiment, the method includes forming a plurality of semiconductor slices having a uniform width, at least two of the semiconductor slices having different lengths, and each of the semiconductor slices having a slice edge defining a side of the semiconductor slice. The method further includes arranging the semiconductor slices to form a semi-rectangular shape defining boundaries of the image sensor, each of the semiconductor slices being disposed proximate to another semiconductor slice of the plurality of semiconductor slices. Forming each semiconductor slice includes forming a plurality of pixel arrays over the semiconductor slice, the pixel arrays having an approximately uniform pixel pitch, and forming a seal ring around the semiconductor slice, the seal ring enclosing the semiconductor slice and the pixel arrays of the semiconductor slice, and each semiconductor slice having a different seal ring.

7 Claims, 5 Drawing Sheets

(52) U.S. Cl.
CPC .. *H01L 27/14605* (2013.01); *H01L 27/14607* (2013.01); *H01L 27/14632* (2013.01); *H01L 27/14636* (2013.01); *H01L 27/14658* (2013.01); *H01L 27/14663* (2013.01); *H01L 27/14687* (2013.01); *H01L 27/14689* (2013.01)

(58) Field of Classification Search
CPC ......... H01L 27/14687; H01L 27/14689; H01L 27/14605; H01L 27/1463; H01L 27/1464; H01L 27/14663
See application file for complete search history.

(56) References Cited

U.S. PATENT DOCUMENTS

| | | | |
|---|---|---|---|
| 2002/0190215 A1* | 12/2002 | Tashiro | H01L 27/14658 250/370.11 |
| 2005/0179213 A1 | 8/2005 | Huang et al. | |
| 2008/0019477 A1* | 1/2008 | Spartiotis | A61B 6/14 378/38 |
| 2009/0179141 A1 | 7/2009 | Sarig et al. | |
| 2010/0220226 A1 | 9/2010 | Wang et al. | |
| 2011/0135057 A1* | 6/2011 | Mori | A61B 6/06 378/62 |
| 2011/0297839 A1 | 12/2011 | Berauer | |
| 2013/0256543 A1 | 10/2013 | Granfors et al. | |
| 2014/0264710 A1 | 9/2014 | Chien et al. | |
| 2014/0268609 A1 | 9/2014 | Chien et al. | |
| 2015/0069252 A1 | 3/2015 | Eichenseer | |
| 2015/0303228 A1* | 10/2015 | Rohr | H01L 27/14603 250/366 |

OTHER PUBLICATIONS

Extended European Search Report dated Mar. 16, 2017, issued in related co-pending EP16185700.8.

* cited by examiner

IMAGE SENSOR AND A METHOD TO MANUFACTURE THEREOF

BACKGROUND

The present disclosure relates generally to image sensors and methods for manufacturing image sensors.

It is a standard practice in stitching technology to divide an integrated circuit having large dimensions into different unit blocks, and form components of the integrated circuit over these unit blocks. It is standard practice in photolithography to create unit blocks having rectangular shapes. A photomask defining a pattern for fabrication of components on one or more unit blocks is produced. A set of photomasks, each defining a pattern layer of the integrated circuit, is produced and used to mass produce the components of the integrated circuit.

Image sensors manufactured as image detectors typically are rectangular shaped and are formed over wafers (semiconductor material) that are round. Forming rectangular shaped image sensors over a round wafer does not fully utilize area of the wafer, resulting in wasted space. Image sensors components that are too large to be formed over portions of the round wafer are formed on a different wafer. Tiling different image sensors components formed over different wafers is both technically difficult and financially costly. Furthermore, pixel arrays on these image sensors are exposed to beams of radiation that that are circular shaped. Given that the pixel arrays are rectangular shaped, sections of the pixel arrays outside of an area exposed to a beam of radiation cannot be utilized.

One proposal to decrease wasted space and to increase yield potential of the pixel arrays is to form a non-rectangular shaped image sensor that has dimensions approximate to an area exposed by the beam and to form non-rectangular shaped pixel arrays over the non-rectangular shaped image sensor. However, a non-rectangular shaped image sensor, unlike a rectangular shaped image sensor, does not have uniform width. When blocks containing other components of the image sensor are arranged proximate to a non-rectangular shaped pixel array, the non-rectangular shape of the pixel array causes some of the other components of the image sensor to come into contact with the pixel array, and renders pixels in contact with other components of the image sensor unusable. Furthermore, enclosing the non-rectangular shaped image sensor with a seal-ring requires creating additional unit blocks. Additional masks are required to fabricate the new unit blocks. However, increasing the number of masks needed to fabricate components of the image sensor significantly increases production costs. Furthermore, increasing the total number of masks needed also significantly increases the technical difficulties associated with fabricating the new implementation.

BRIEF SUMMARY OF THE DISCLOSED EMBODIMENTS

The disclosed embodiments provide non-rectangular shaped image sensors and methods to manufacture non-rectangular shaped image sensors that provide increased yield potential without a significant increase in production costs or manufacturing complexity.

In accordance with an illustrative embodiment, a complementary metal-oxide-semiconductor (CMOS) image sensor is provided. The CMOS image sensor includes a plurality of semiconductor slices having a uniform width. The plurality of semiconductor slices are formed of different lengths and are arranged to form a semi-rectangular shape defining boundaries of the CMOS image sensor. Each of the plurality of semiconductor slices is disposed proximate to another semiconductor slice of the plurality of semiconductor slices. Furthermore, each semiconductor slice of the plurality of semiconductor slices has a slice edge defining a side of the semiconductor slice. Each semiconductor slice of the plurality of semiconductor slices includes a plurality of pixel arrays having an approximately uniform pixel pitch. Each semiconductor slice of the plurality of semiconductor slices also includes a guard ring having n type conductivity surrounding the plurality of pixel arrays. Each semiconductor slice of the plurality of semiconductor slices also includes a seal ring enclosing the semiconductor slice. Each semiconductor slice of the plurality of semiconductor slices further includes a column of row-driver circuitry. The column of row-driver circuitry is positioned proximate to the plurality of pixel arrays along a first side of the plurality of pixel arrays. The guard ring, the row-driver circuitry, the slice edge, the seal ring, a seal ring of another semiconductor slice disposed proximate to the semiconductor slice, a slice edge of the other semiconductor slice, and a guard ring of the other semiconductor slice have a combined width of less than or equal to one pixel pitch.

In accordance with another illustrative embodiment, an image sensor is provided. The image sensor includes a plurality of semiconductor slices having a uniform width. The plurality of semiconductor slices are formed of different lengths and are arranged to form a semi-rectangular shape defining boundaries of the image sensor. Each of the plurality of semiconductor slices is disposed proximate to another semiconductor slice of the plurality of semiconductor slices. Each semiconductor slice of the plurality of semiconductor slices has a slice edge defining a side of the semiconductor slice. Each semiconductor slice of the plurality of semiconductor slices includes a plurality of pixel arrays having a uniform pixel pitch. Each semiconductor slice of the plurality of semiconductor slices also includes a seal ring enclosing the semiconductor slice. Each semiconductor slice of the plurality of semiconductor slices also includes a column of row-driver circuitry.

In accordance with another illustrative embodiment a method for manufacturing an image sensor is provided. The method includes forming a plurality of semiconductor slices having a uniform width. At least two of the plurality of semiconductor slices have different lengths, and each of the plurality of semiconductor slices has a slice edge defining a side of the semiconductor slice. The method further includes arranging the plurality of semiconductor slices to form a semi-rectangular shape defining boundaries of the image sensor, each of the plurality of semiconductor slices being disposed proximate to another semiconductor slice of the plurality of semiconductor slices. For each semiconductor slice of the plurality of semiconductor slices, the method further includes forming a plurality of pixel arrays over the semiconductor slice, the plurality of pixel arrays having an approximately uniform pixel pitch. For each semiconductor slice of the plurality of semiconductor slices, the method further includes forming a seal ring around the semiconductor slice, the seal ring enclosing the semiconductor slice and the plurality of pixel arrays of the semiconductor slice, where each of the plurality of semiconductor slices has a different seal ring.

Additional details of the disclosed embodiments are provided below in the detailed description and corresponding drawings.

BRIEF DESCRIPTION OF THE DRAWINGS

Illustrative embodiments of the present invention are described in detail below with reference to the attached drawing figures, which are incorporated by reference herein, and wherein.

The illustrated figures are only exemplary and are not intended to assert or imply any limitation with regard to the environment, architecture, design, or process in which different embodiments may be implemented.

DETAILED DESCRIPTION

Figure 1:
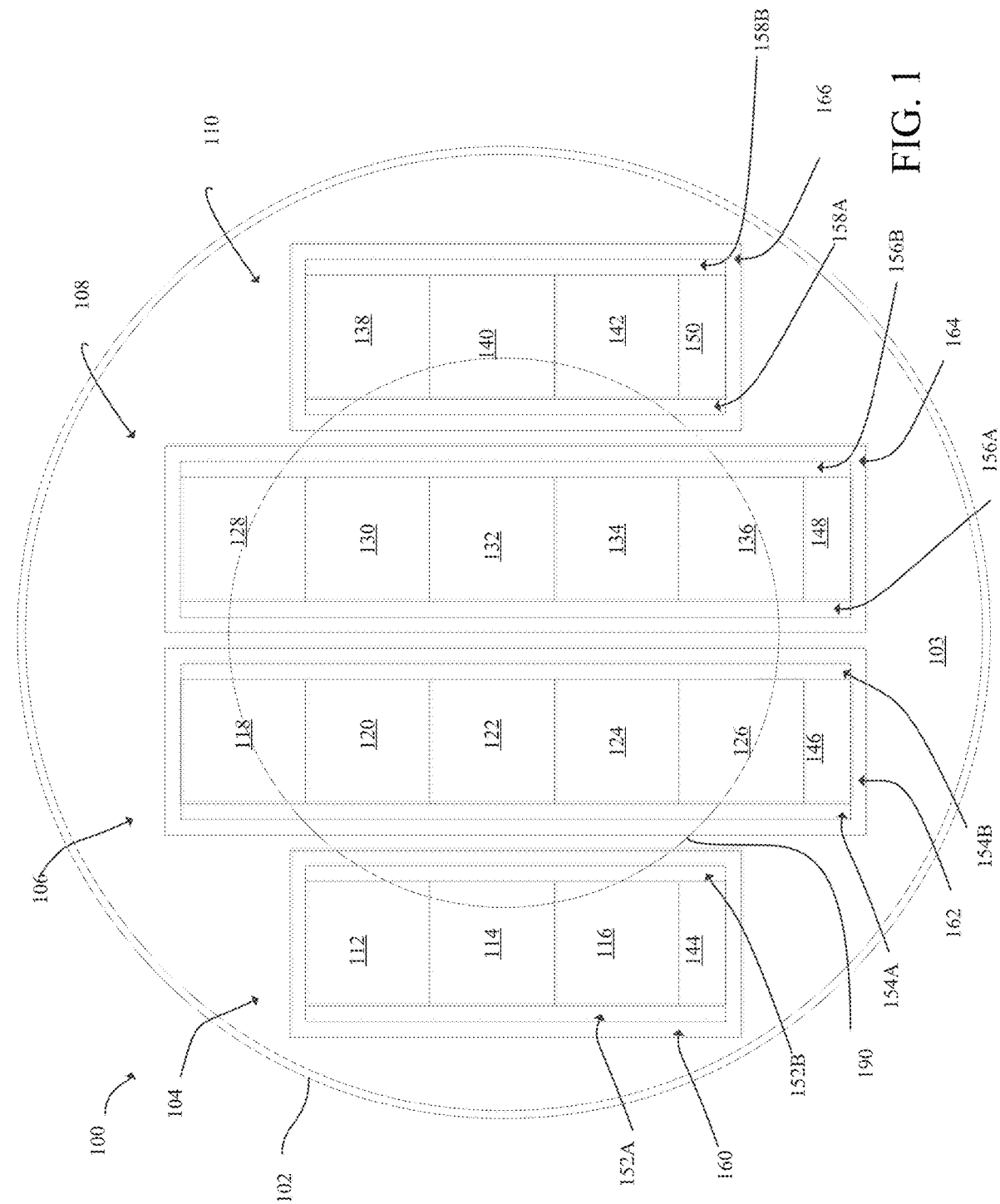
FIG. 1 illustrates a round image sensor in accordance with one embodiment.

FIG. 1 illustrates an image sensor 100 in accordance with one embodiment. The image sensor 100 has dimensions defined by boundaries 102. The image sensor 100 as illustrated in FIG. 1 has circular dimensions. The image sensor 100 may be manufactured to form a variety of shapes, including rectangular shapes, and semi-rectangular shapes, which as used herein, includes any shape that is not rectangular. The image sensor 100 is fabricated on a monocrystalline semiconductor substrate 103. Alternatively, the image sensor 100 may be fabricated on a polysilicon substrate or a substrate made of any other suitable semiconductor material. As illustrated in FIG. 1, components of the image sensor 100 are formed over different portions of the substrate 103 during photolithography.

Image sensor 100 includes a first semiconductor slice 104, a second semiconductor slice 106, a third semiconductor slice 108, and a fourth semiconductor slice 110. The first, second, third, and fourth semiconductor slices 104, 106, 108, and 110 are formed over areas of the substrate 103 and include components configured to detect and measure electromagnetic radiation generated by one or more beams of electromagnetic radiation energy. In a preferred embodiment, each of the semiconductor slices 104, 106, 108, and 110 includes components that are configured to perform functions separate from the other semiconductor slices. Various components formed over each of the semiconductor slices 104, 106, 108, and 110 are discussed in greater detail in the paragraphs below.

The first, second, third, and fourth semiconductor slices 104, 106, 108, and 110 have rectangular shapes and have an approximately uniform width. As used herein, an "approximately uniform width" is defined to include uniform width. Furthermore, the first, second, third, and fourth semiconductor slices 104, 106, 108, and 110 each has two sides at slice edges 152A and 152B, 154A and 154B, 156A and 156B, and 158A and 158B, respectively. In some embodiments, a slice edge defines a side of a semiconductor slice. In other embodiments, the slice edge defines a transition area having a finite width along a side of the semiconductor slice between a seal ring that surrounds the semiconductor slice and a guard ring that is proximate to the slice edge. In other embodiments, the slice edge defines transition areas proximate to a different number of sides of the semiconductor slice.

Various stitching technologies may be used to form the boundaries of the first, second, third, and fourth semiconductor slices 104, 106, 108, and 110, and to align the first, second, third, and fourth semiconductor slices 104, 106, 108, and 110. Stitching techniques are discussed in greater detail in the paragraphs below. The image sensor 100 illustrated in FIG. 1 includes four semiconductor slices 104, 106, 108, and 110 aligned proximate to each other to form a semi-rectangular area.

As used herein, a "semi-rectangular" shape is defined as any enclosed area that does not form a rectangular shape. Accordingly, a semi-rectangular shape includes ellipses. As used herein, an "ellipse" is defined as a curve on a plane surrounding two focal points such that the sum of the distances to the two focal points is constant for every point on the curve. An ellipse is defined to include a circle, which is a special type of ellipse, where both foci are at the same point.

The first semiconductor slice 104 includes pixel arrays 112, 114, and 116 formed over the first semiconductor slice 104. Each of the pixel arrays 112, 114, and 116 includes a plurality of individual pixels (not shown) arranged in rows and columns. Pixels are discussed in detail in the paragraphs below. Each of the pixel arrays 112, 114, and 116 is configured to receive electromagnetic radiation information and to output a corresponding signal. While the first semiconductor slice 104 illustrated in FIG. 1 includes three pixel arrays 112, 114, and 116, in other embodiments, the pixel arrays 112, 114, and 116 combine to form one pixel array. In a preferred embodiment, the pixel arrays 112, 114, and 116 are manufactured using CMOS technology. In other embodiments, the pixel arrays 112, 114, and 116 may be manufactured using CCD or other similar technologies. In the preferred embodiment, the pixel arrays 112, 114, and 116 are covered by a layer of a scintillator material. The scintillator material converts incoming x-ray photons into a form of visible light (e.g., a green light). The pixel arrays 112, 114, and 116 convert the green light into electrical signals corresponding to the incoming x-ray photons. Alternatively, electromagnetic radiation signals from a wide frequency range including, but not limited to, gamma ray radiation, ultraviolet radiation, visible light radiation, and infrared radiation can be converted by an optional conversion layer into a form of visible light and further converted by the pixel arrays 112, 114, and 116 to electrical signals, or directly converted by the pixel arrays 112, 114, and 116 to electrical signals. The semiconductor slice 104 includes a guard ring (not shown) formed around the pixel arrays 112, 114, and 116 to insulate the pixel arrays 112, 114, and 116 from noise generated by other components formed or present over the substrate 103. Guard rings are illustrated and are discussed in greater detail in the paragraphs below.

The image sensor 100 illustrated in FIG. 1 also includes pixel arrays 118, 120, 122, 124, and 126, formed over the second semiconductor slice 106. Furthermore, the image sensor 100 also includes pixel arrays 128, 130, 132, 134, and 136, formed over the third semiconductor slice 108. Furthermore, the image sensor 100 also includes pixel arrays 138, 140, and 142, formed over the fourth semiconductor slice 110. Together, the pixel arrays 112, 114, 116, 118, 120, 122, 124, 126, 128, 130, 132, 134, 136, 138, 140, and 142 are arranged to form a semi-rectangular area that surrounds an area of electromagnetic radiation exposure 190. According to another embodiment, a different number of pixel arrays are formed over their respective semiconductor slices to form an area covering an area of electromagnetic radiation exposure having dimensions different from the dimensions of the area of electromagnetic radiation exposure 190.

The pixel arrays 112, 114, 116, 118, 120, 122, 124, 126, 128, 130, 132, 134, 136, 138, 140, and 142 are arranged to form a shape similar to the area of electromagnetic radiation exposure 190. In particular, the pixel arrays 112, 114, 116, 118, 120, 122, 124, 126, 128, 130, 132, 134, 136, 138, 140, and 142 are arranged to form an area identical to, approximately the same as, or slightly greater than the area of electromagnetic radiation exposure 190 in order to ensure substantial coverage of the area of electromagnetic radiation exposure and to maximize the yield potential of the pixel arrays 112, 114, 116, 118, 120, 122, 124, 126, 128, 130, 132, 134, 136, 138, 140, and 142. Alternatively, for certain applications, the pixel arrays 112, 114, 116, 118, 120, 122, 124, 126, 128, 130, 132, 134, 136, 138, 140, and 142 can be arranged to form an area slightly smaller than the area of electromagnetic radiation exposure 190 to reduce the required surface area of the pixel array and yet maintain substantial coverage of the area of radiation exposure. As one of ordinary skill in the art will appreciate, while the slices of pixel arrays are rectangular shaped and selected to be of different heights to best approximate the general shape of an arcuate area of electromagnetic radiation, the height and arrangement of such slices may be varied in different embodiments without departing from the scope of the invention. As illustrated in FIG. 1, each pixel array of the pixel arrays 112, 114, 116, 118, 120, 122, 124, 126, 128, 130, 132, 134, 136, 138, 140, and 142 is partially or completely within the area electromagnetic radiation exposure 190.

The first semiconductor slice 104 also includes control and readout circuitry 144 formed over the first semiconductor slice 104. In some embodiments, the readout circuitry 144 includes circuitry such as analog-to-digital conversion (ADC) circuitry. The control and readout circuitry 144 is configured to control operations performed by the pixel arrays 112, 114, and 116 and row-driver circuitry formed over the first semiconductor slice 104 (not shown). The control and readout circuitry 144 may also be configured to convert analog signals of electromagnetic radiation received at the pixel arrays 112, 114, and 116 into a digital representation. Similarly, the second semiconductor slice 106 includes control and readout circuitry 146 formed over the second semiconductor slice 106. The control and readout circuitry 146 is configured to control operations performed by the pixel arrays 118, 120, 122, 124, and 126 and row-driver circuitry formed over the second semiconductor slice 106 (not shown). Similarly, the third semiconductor slice 108 includes control and readout circuitry 148 formed over the third semiconductor slice 108. The control and readout circuitry 148 is configured to control operations performed by the pixel arrays 128, 130, 132, 134, and 136 and row-driver circuitry formed over the third semiconductor slice 108 (not shown). Similarly, the fourth semiconductor slice 110 includes control and readout circuitry 150 formed over the fourth semiconductor slice 110. The control and readout circuitry 150 is configured to control operations performed by the pixel arrays 138, 140, and 142 and row-driver circuitry formed over the fourth semiconductor slice 110 (not shown).

According to one embodiment, the control and readout circuitry 144 is configured to control pixel arrays 112, 114, and 116 independent from control and readout circuitries 146, 148, and 150. For example, the control and readout circuitry 144 is configured to convert analog signals of electromagnetic radiation received at the pixel arrays 112, 114, and/or 116 into digital representations of the received signals independent from control and readout circuitries 146, 148, 150. Similarly, the control and readout circuitries 146, 148, and 150 are configured to control pixel arrays formed over semiconductor slice 106, 108, or 110, respectively, independent from other control and readout circuitries. In a case where the area of electromagnetic radiation exposure 190 is only covered by select pixel arrays formed over select semiconductor slices, only the control and readout circuitry of those select semiconductor devices are activated to convert the received signals at the exposed areas into digital representations. As such, the image sensor 100 can operate with greater efficiency. Furthermore, if the control and readout circuitry formed over a semiconductor slice malfunctions, the malfunction is local to the semiconductor slice and does not prevent other control and readout circuitries formed over other semiconductor slices from receiving and converting analog signals of electromagnetic radiation received at pixel arrays formed over the other semiconductor slices.

As illustrated in FIG. 1, the control and readout circuitry 144 is disposed proximate to the pixel array 116, the control and readout circuitry 146 is disposed proximate to the pixel array 126, the control and readout circuitry 148 is disposed proximate to pixel array 136, and the control and readout circuitry 150 is disposed proximate to the pixel array 142. In another embodiment, control and readout circuitries 144, 146, 148, and/or 150 are disposed adjacent to multiple pixel arrays. In another embodiment, the control and readout circuitries 144, 146, 148, and/or 150 are disposed at a different location on their respective semiconductor slice. In a further embodiment, the control and readout circuitries 144, 146, 148, and/or 150 each includes two or more components that are disposed at different locations on their respective semiconductor slices. Additional control and readout circuitry (not shown) may also be formed over each of the semiconductor slices 104, 106, 108, and 110 to facilitate conversion of analog signals of electromagnetic radiation received at pixel arrays formed over the respective semiconductor slice into digital signals and to serve as back up in case one of the control and readout circuitries 144, 146, 148, and 150 malfunctions.

The semiconductor devices formed on the first semiconductor slice 104 are enclosed by a seal ring 160. In one embodiment, the seal ring 160 is a trench that extends around the periphery of the first semiconductor slice 104. Alternatively, the seal ring 160 may be a trench that extends around the periphery of the first semiconductor slice 104 but is filled with a material different than the substrate material which is typically silicon or other suitable materials. In one embodiment, the seal ring 160 includes metal layers, dielectric layers, and via. In such embodiment, a metal layer of the seal ring 160 is electrically connected to a p type substrate. The seal ring 160 is also electrically connected and/or coupled to a ground connection. The seal ring 160 is generally rectangular in shape and includes two sets of opposed generally parallel sides and adjacent sides that are generally orthogonal to each other. However, in one embodiment, the seal ring 160 may have arcuate or polygonal corner junctions to prevent stress and charge concentration that may damage the first semiconductor slice 104. In general, the seal ring 160 protects the semiconductor devices formed on the first semiconductor slice 104 from stress energy of other slices or electrical components external to the first semiconductor slice 104. Stress energy in components external to the semiconductor slice 104 could propagate to and destroy the semiconductor devices on the first semiconductor slice 104 on the semiconductor chip if not for the presence of the seal ring 160. Furthermore, the seal ring 160 also protects the components formed over the first semiconductor slice 104 from abutting against other components formed over other semiconductor slices. Furthermore, the seal ring 160 also maintains structural integrity of the first semiconductor slice 104 and components formed over the first semiconductor slice 104 during different photolithography procedures. Similarly, seal rings 162, 164, and 166 also provide similar protection for components formed on the second, third, and fourth semiconductor slices 106, 108, and 110, respectively.

Additional circuitries, such as, but not limited to row-driver circuitry are formed over the first, second, third, and fourth semiconductor slices 104, 106, 108, and 110. Furthermore, additional components, such as printed circuit board (PCB), scintillator materials, etc., may also be formed over and/or disposed proximate to the substrate 103. Details of these components are further discussed in the paragraphs below and are illustrated by subsequent figures.

Figure 2A:
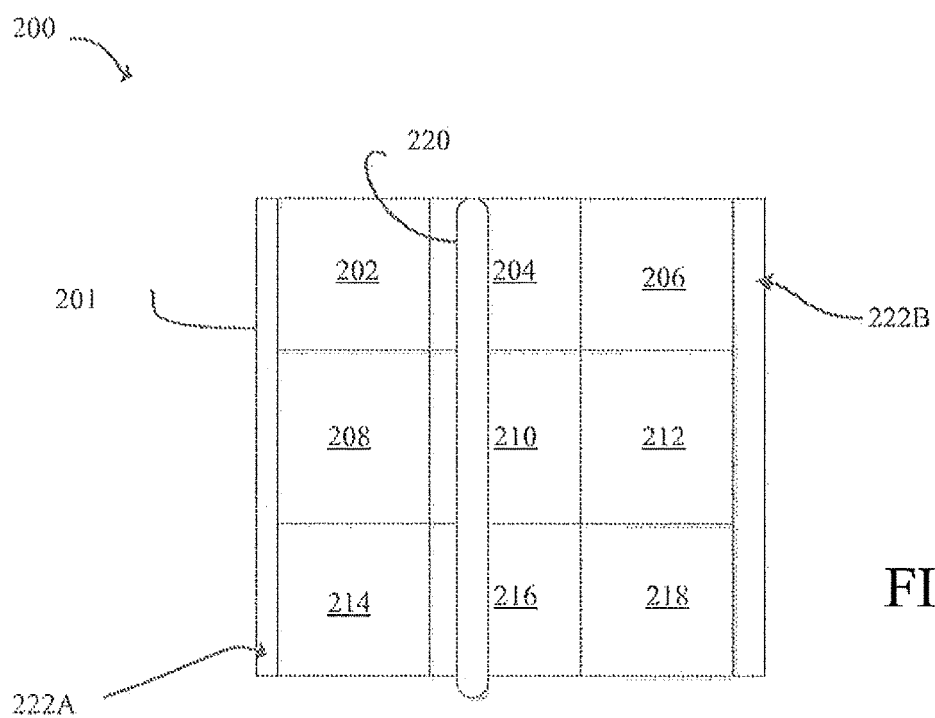
FIG. 2A illustrates a semiconductor slice containing a pixel array and row-driver circuitry in accordance with one embodiment.

FIG. 2A illustrates a semiconductor slice containing a pixel array 201 and row-driver circuitry 220 in accordance with one embodiment. The pixel array 201 is a 3×3 grid and includes pixels 202, 204, 206, 208, 210, 212, 214, 216, and 218. The pixel array 201 has a pixel pitch defined by an approximate width of a pixel in the pixel array 201. As illustrated in FIG. 2A, the pixel array 201 is formed over semiconductor slice 200, which has two sides defined by slice edges 222A and 222B. The row-driver circuitry 220 is configured to deliver voltage to the pixels 202, 204, 206, 208, 210, 212, 214, 216, and 218 to control the accumulation, transfer, and resetting of signals accumulated in each pixel. The row-driver circuitry 220 may also be configured to control the transfer of signals received at the pixels 202, 204, 206, 208, 210, 212, 214, 216, and 218 of the pixel array 201 to a control and readout circuitry (not shown). As illustrated in FIG. 2A, the row-driver circuitry 220 is disposed proximate to pixels 204, 210, and 216. The presence of the row-driver circuitry 220 proximate to the pixels 204, 210, and 216 reduces the surface area of the pixels, and thereby reduces the sensitivity of the pixels 204, 210, and 216 to electromagnetic radiation. As such, a column of pixels proximate to the row-driver circuitry 220 is considered a dead column.

Figure 2B:
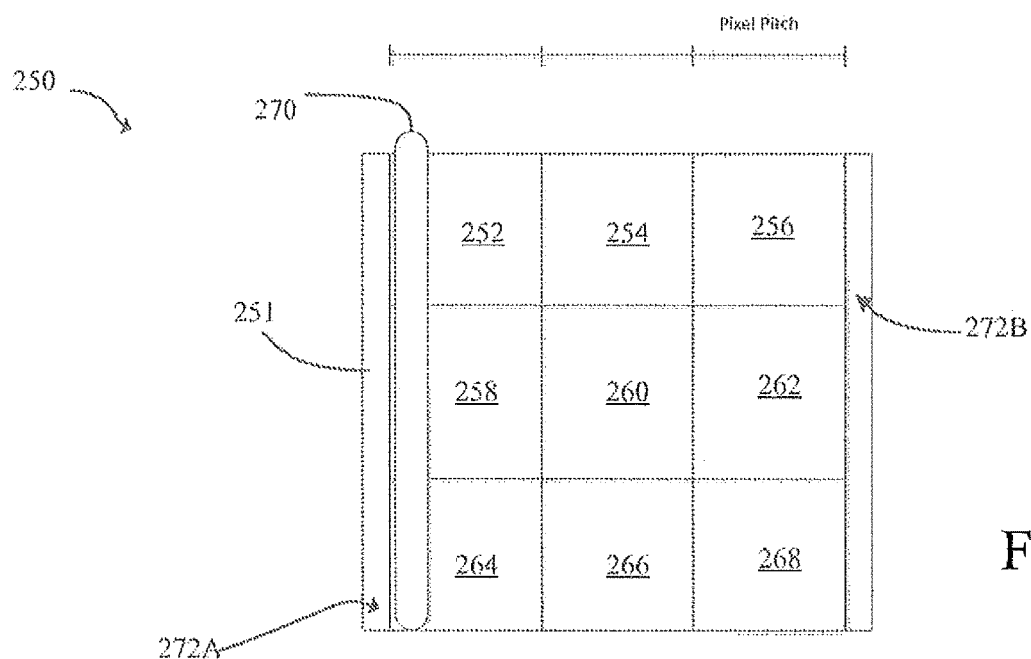
FIG. 2B illustrates a semiconductor slice containing a pixel array and row-driver circuitry in accordance with another embodiment.

FIG. 2B illustrates a semiconductor slice containing a pixel array 251 and row-driver circuitry 270 in accordance with another embodiment. Similar to the pixel array 201 of FIG. 2A, the pixel array 251 is also a 3×3 grid and includes pixels 252, 254, 256, 258, 260, 262, 264, 266, and 268. The pixel array 251 is formed over semiconductor slice 250, which has two sides defined by slice edges 272A and 272B. The row-driver circuitry 270 is disposed along a side of the pixel array 251 and is disposed proximate to pixels 252, 258, and 264. While the proximity between the row-driver circuitry 270 and the pixels 252, 258, and 264 also creates a dead column of pixels, the configuration illustrated in FIG. 2B reduces overall number of dead columns of pixels relative to the configuration illustrated in FIG. 2A and is discussed in detail in the below paragraphs.

Figure 3:
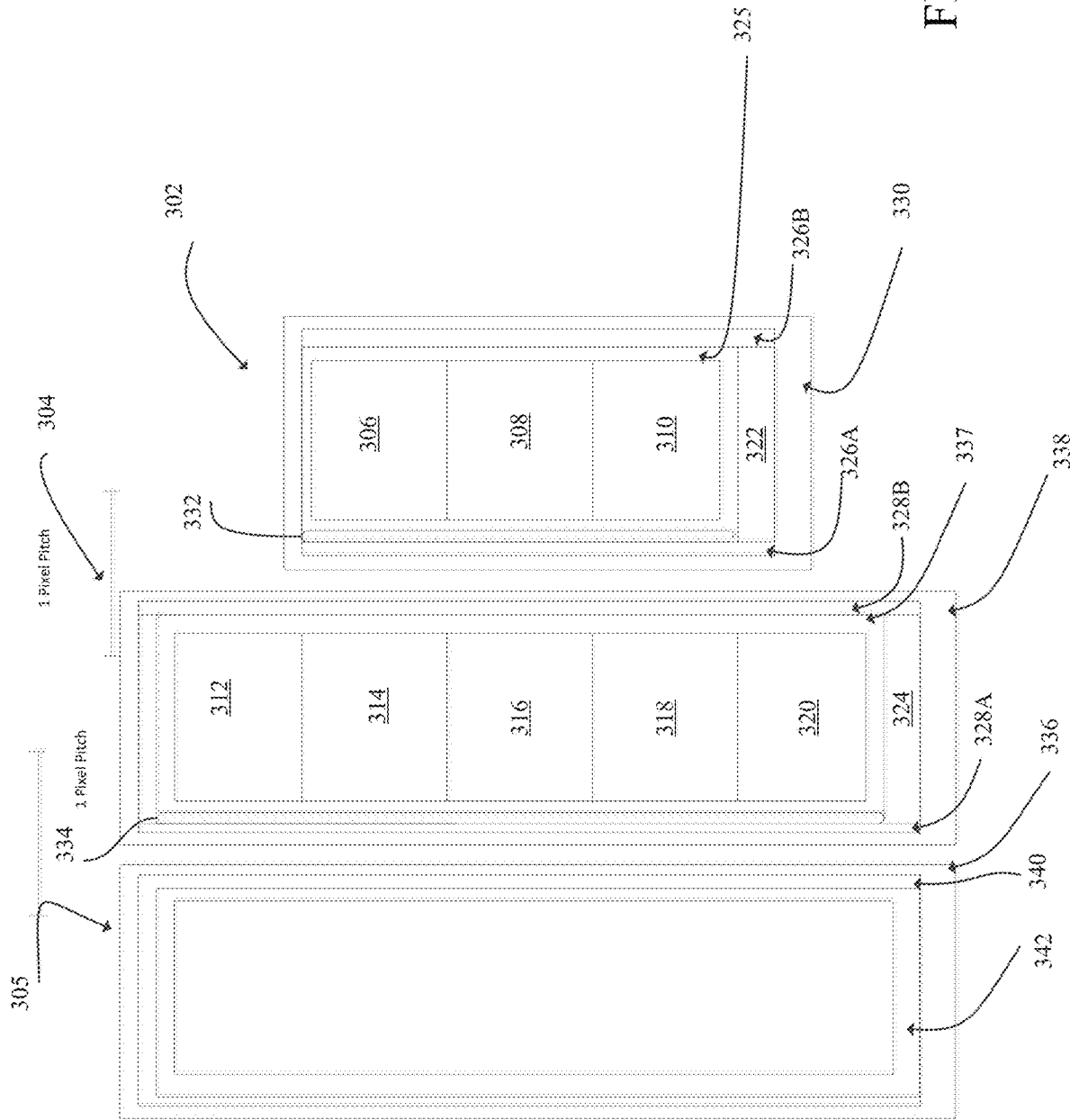
FIG. 3 illustrates three semiconductor slices disposed proximate to each other in accordance with one embodiment.

FIG. 3 illustrates three semiconductor slices 302, 304 and 305 disposed proximate to each other in accordance with one embodiment. A first semiconductor slice 302 has two sides defined by slice edges 326A and 326B and is enclosed by a seal ring 330. In one embedment, slice edges 326A and 326B define two sides of the semiconductor slice 302. Pixel arrays 306, 308, and 310 are formed over first semiconductor slice 302. Control and readout circuitry 322 and row-driver circuitry 332 are disposed over the first semiconductor slice 302. In an embodiment illustrated in FIG. 3, a guard ring 325 is formed around the pixel arrays 306, 308, and 310 of the first semiconductor slice 302. In the embodiment illustrated in FIG. 3, the guard ring 325 is doped to have a n type electrical conductivity. In other embodiments, the guard ring 325 is doped to have a p type electrical conductivity. The guard ring 325 extends down to a subsurface of the substrate of the three semiconductor slices 302, 304, and 305, and is formed to insulate the pixel arrays 306, 308, and 310 from noise generated by other components (e.g., the control and readout circuitry 322, the row-driver circuitry 332, etc.,) formed or present over the substrate.

In the embodiment illustrated in FIG. 3, a single guard ring 325 is formed around the pixel arrays 306, 308, and 310. Additional guard rings may also be formed around one or more pixels of the pixel arrays 306, 308, and 310 to insulate the one or more pixels from noise generated by other pixels of the pixel arrays 306, 308, and 310, and from noise generated by other components formed over the substrate. In other embodiments, a separate guard ring is formed around each pixel of the pixel arrays 306, 308, and 310 to further insulate the respective pixel from noise generated by other pixels and/or other components formed over the substrate. In such embodiments, the single guard ring 325 may not be formed around the pixel arrays 306, 308, and 310. In other embodiments, a guard ring is not formed around any of the pixel arrays 306, 308, 310, 312, 314, 316, 318, or 320.

In the embodiment illustrated in FIG. 3, a second semiconductor slice 304 has two sides defined by slice edges 328A and 328B and is enclosed by a seal ring 338. FIG. 3 also illustrates a third semiconductor slice 305 disposed proximate to the second semiconductor slice 304. The third semiconductor slice 305 has a side defined by a slice edge 340 and is enclosed by a seal ring 336. Seal rings 330, 336, and 338 do not include any component configured to receive electromagnetic radiation information. As such, areas of the substrate covered by the seal rings 330, 336, and 338 are not configured to receive electromagnetic radiation information and are considered dead space.

Pixel arrays 312, 314, 316, 318, and 320 are formed over the second semiconductor slice 304. A guard ring 337 is formed around the pixel arrays 312, 314, 316, 318, and 320 of the second semiconductor 304 to insulate the pixel arrays 312, 314, 316, 318, and 320 from noise generated by other components that are formed on the substrate. The second semiconductor slice 304 also includes control and readout circuitry 324 and row-driver circuitry 334 disposed over the second semiconductor slice 304. Similar to the configuration illustrated in FIG. 2B, row-driver circuitries 332 and 334 are disposed on a side of pixel arrays 306, 308, 310, 312, 314, 316, 318, and 320 and are proximate to pixels located on the edge of the pixel arrays 306, 308, 310, 312, 314, 316, 318, and 320.

As illustrated in FIG. 3, the guard ring 325 of the first semiconductor slice 302, the row-driver circuitry 332 of the first semiconductor slice 302, the slice edge 326A of the first semiconductor slice 302, the seal ring 330 of the first semiconductor slice 302, the seal ring 338 of the second semiconductor slice 304, the slice edge 328B of the second semiconductor slice 304, and the guard ring 337 of the second semiconductor slice 304 are fabricated to have a combined width of less than one pixel pitch. In other embodiments, the combined width of row-driver circuitry 332, the guard rings 325 and 337, the slice edges 326A and 328B, and the seal rings 330 and 338 are fabricated to have a width of up to two pixel pitches. In such embodiments, the width of the row-driver circuitry 332, the guard rings 325 and 337, the slice edges 326A and 328B, and/or the seal rings 330 and 338 are increased in order to accommodate various fabrication implementations and semiconductor device requirements, such as, but not limited to, noise tolerance level of the components of the pixel arrays formed on the substrate, the amount of stress the substrate is subject to during the fabrication process, the type of semiconductor devices used to form the row-driver circuitries, the number of semiconductor devices used to form the row-driver circuitries, and dimensions of the semiconductor slices formed over the substrate.

In one example, where pixel arrays 306, 308, and 310 are highly sensitive to noise, the guard ring 325 has wide trenches to insulate the pixel arrays 306, 308, and 310. In another example, multiple stitching operations are performed during the fabrication process. As such, seal rings 330 and 338 have wide trenches to protect components formed over the semiconductor slices 302 and 304 to maintain the structural integrity of the semiconductor slices 302 and 304 during the fabrication process. In a further example, additional semiconductor devices are added to the row-driver circuitries 332 and 334 to control the accumulation, transfer, and resetting of signals accumulated in each pixel of the pixel arrays 306, 308, and 310. In such embodiments, the row-driver circuitry 332, the guard rings 325 and 337, the slice edges 326A and 328B, and the seal rings 330 and 338 may be fabricated to have a combined width of less than or equal to 2 pixel pitches, less than 1.5 pixel pitches, less than 1.1 pixel pitches, or approximately one pixel pitch. As used herein, "approximately equal to one pixel pitch" is defined to mean between one pixel pitch and 1.01 pixel pitches. In other embodiments, the row-driver circuitry 332, the guard rings 325 and 337, the slice edges 326A and 328B, and the seal rings 330 and 338 are fabricated to have a combined width that is different from the ranges discussed above to accommodate various technical requirements and fabrication procedures.

Similarly, the guard ring 337 of the second semiconductor slice 304, the row-driver circuitry 334 the second semiconductor slice 304, the slice edge 328A of the second semiconductor slice 304, the seal ring 338 of the second semiconductor slice 304, the seal ring 336 of the third semiconductor slice 305, the slice edge 340 of the third semiconductor slice 305, and the guard ring 342 of the third semiconductor slice 305 are also fabricated to have a combined width of less than or equal to one pixel pitch. In other embodiments, the guard ring 337 of the second semiconductor slice 304, the row-driver circuitry 334 the second semiconductor slice 304, the slice edge 328A of the second semiconductor slice 304, the seal ring 338 of the second semiconductor slice 304, the seal ring 336 of the third semiconductor slice 305, the slice edge 340 of the third semiconductor slice 305, and the guard ring 342 of the third semiconductor slice 305 are also fabricated to have a combined width of less than or equal to two pixel pitches, less than or equal to 1.5 pixel pitches, less than or equal to 1.1 pixel pitches, less than or equal to 1.01 pixel pitches, or approximately one pixel pitch.

In other embodiments, pixel arrays 312, 314, 316, 318, and 320 are not surrounded by guard rings. In such embodiments, the row-driver circuitry 334 the second semiconductor slice 304, the slice edge 328A of the second semiconductor slice 304, the seal ring 338 of the second semiconductor slice 304, and the seal ring 336 of the third semiconductor slice 305 are fabricated to have a combined width of less than or equal to one pixel pitch. While individual pixels are not illustrated in FIG. 3, the pixel arrays 306, 308, 310, 312, 314, 316, 318, and 320 each contains several rows and columns of pixels. As such, only one column of dead space is realized from the configuration illustrated in FIGS. 2B and 3.

Figure 4:
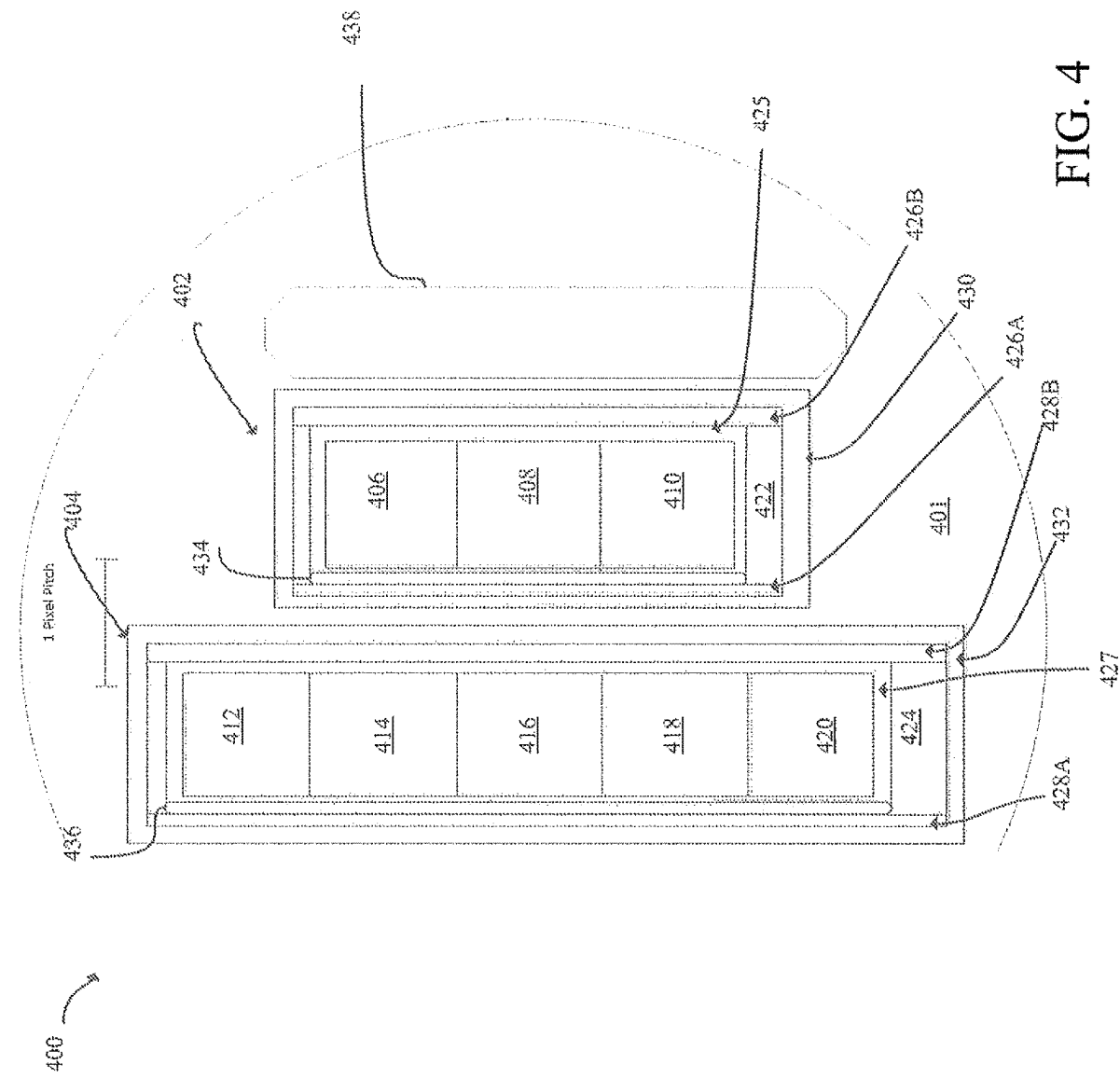
FIG. 4 illustrates a portion of a round image sensor in accordance with another embodiment.

FIG. 4 illustrates a portion of a round image sensor 400 in accordance with another embodiment. The image sensor 400 is fabricated on a substrate 401. The image sensor 400 includes a first semiconductor slice 402 and a second semiconductor slice 404 formed over the substrate 401. The first and second semiconductor slices 402 and 404 include pixel arrays 406, 408, 410, surrounded by guard ring 425, and pixel arrays 412, 414, 416, 418, 420, surrounded by guard ring 427, respectively. The first and second semiconductor slices 402 and 404 also include control and readout circuitries 422 and 424, and row-driver circuitries 434 and 436. The first and second semiconductor slices 402 and 404 also have two sides defined by slice edges 426A and 426B, and by 428A and 428B, respectively, and are enclosed by seal rings 430 and 432, respectively. Additional circuitry, such as but not limited to printed circuit boards, and/or additional materials, such as, but not limited to scintillator material may also be disposed and/or formed over the substrate 401. As illustrated in FIG. 4, additional circuitry 438 is disposed proximate to the first semiconductor slice 402. In other embodiments, the additional circuitry may be disposed or formed over another portion the substrate 401.

Figure 5:
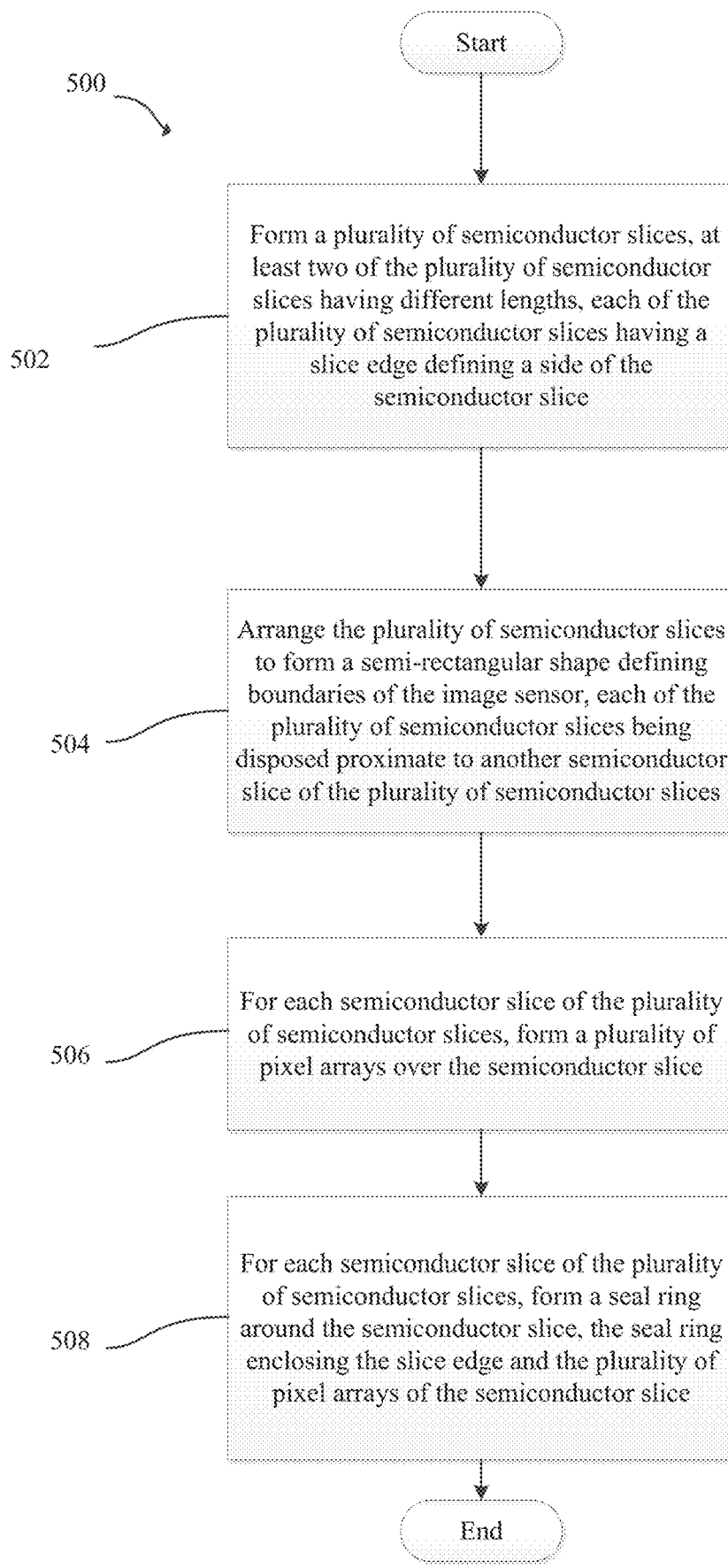
FIG. 5 is a flowchart illustrating a process for manufacturing an image sensor in accordance with one embodiment.

FIG. 5 is a flowchart illustrating a process for manufacturing an image sensor in accordance with one embodiment. Although operations in process 500 are shown in a particular order, certain operations may be performed in different orders or at the same time.

A substrate used to fabricate components of an image sensor is formed. In some embodiments, a substrate having a diameter between 200 millimeters and 300 millimeters is formed. In other embodiments, a semi-rectangular substrate is formed. At block 502, multiple semiconductor slices are formed over the substrate. The semiconductor slices are formed into rectangular shapes with uniform width. This process includes forming multiple semiconductor slices having approximately the same slice width but different slice lengths. In particular, at least two of the formed semiconductor slices have different lengths. The formed semiconductor slices each has a slice edge, which defines a side of the respective semiconductor slice. In other embodiments, the formed semiconductor slices each has two slice edges, which define two opposite sides of the respective semiconductor slice. In further embodiments, the formed semiconductor slices each has four slice edges, which define the rectangular boundaries of the respective semiconductor slice.

At block 504, the semiconductor slices are arranged to form a semi-rectangular shape that defines boundaries of the image sensor. The semiconductor slices are arranged based on length and are disposed proximate to each other over the substrate. According to one embodiment, a stitching technology, such as, but not limited to, 1D stitching or 2D stitching, can be used to combine proximate semiconductor slices. 1D stitching is one dimensional stitching. In one embodiment, 1D stitching is used when dimensions of a semiconductor material are greater than an available area on a photomask along only one axis (e.g., along an x-axis, or along a y-axis, but not both the x-axis and the y-axis). 2D stitching is two dimensional stitching. In one embodiment, 2D stitching is used when the dimensions of the semiconductor material are greater than the available area on the photomask along two axes (e.g., along both the x-axis and the y-axis).

For each semiconductor slice of the semiconductor slices that has been formed over the substrate, pixel arrays are formed over the semiconductor slice at block 506. Each pixel array includes multiple pixels manufactured using various technologies, including, but not limited to CMOS, charge-coupled device (CCD), etc. The formed pixel arrays are configured to detect a variety of electromagnetic radiations, including, but not limited to, x-ray, gamma ray, infrared, and visible light, etc. The formed pixel arrays have approximately a uniform pixel pitch, defined as the width of a pixel of the pixel arrays. As used herein, "approximately a uniform pixel pitch" includes uniform pixel pitch. As such, pixels of the pixel arrays have identical or substantially identical width.

For each semiconductor slice of the semiconductor slices formed over the substrate, a seal ring is formed around the respective semiconductor slice at block 508. Furthermore, each semiconductor slice of the semiconductor slices formed over the substrate has a different seal ring. The seal ring encloses the semiconductor slice and a plurality of pixel arrays of the respective semiconductor slice. For each semiconductor slice of semiconductor slices formed over the substrate, the process may further include forming a guard ring around the plurality of pixel arrays. The guard ring surrounds the plurality of pixel arrays of the respective semiconductor slice and can be doped to have a n type electrical conductivity or a p type electrical conductivity. The guard ring extends down to a subsurface of the substrate to insulate the pixel arrays from noise generated by other components formed over the substrate.

For each semiconductor slice of the semiconductor slices formed over the substrate, the process may further include inserting a column of row-driver circuitry over the respective semiconductor slice. In one embodiment, the column of row-driver circuitry is inserted in between an edge of the pixel arrays formed over the respective semiconductor slice and a slice edge of the respective semiconductor slice. The guard ring, the row-driver circuitry, the slice edge, the seal ring of the respective semiconductor slice, a seal ring of another semiconductor slice disposed proximate to the respective semiconductor slice, a slice edge of the other semiconductor slice, and a guard ring of the other semiconductor slice are fabricated to have a combined width of less than or approximately equal to one pixel pitch. As such, the combined dead space from the row-driver circuitry and the seal rings is reduced to one column per semiconductor slice.

For each semiconductor slice of the semiconductor slices that is formed over the substrate, control and readout circuitry may also be inserted over the respective semiconductor slice. In order to avoid creating dead space, the control and readout circuitry should not be inserted over a location that abuts any of the pixel arrays formed over the respective semiconductor slice. Furthermore, the control and readout circuitry of a respective semiconductor slice may be configured to independently control the plurality of pixel arrays formed over the respective semiconductor slice.

Additional components and/or circuitry may be disposed over or proximity to the semiconductor material. According to one embodiment, a printed circuit board is attached proximate to a backside of the semiconductor material and a scintillator material is attached proximate to a front side of the semiconductor material. According to another embodiment, a printed circuit board and a scintillator material are both attached proximate to a front side of the semiconductor material.

The above disclosed embodiments have been presented for purposes of illustration and to enable one of ordinary skill in the art to practice the disclosed embodiments, but is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/blocks may be performed in parallel or out of sequence, or combined into a single step/block. The scope of the claims is intended to broadly cover the disclosed embodiments and any such modification.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

As used herein, a "semi-rectangular" shape is defined as any enclosed area that does not form a rectangular shape. Accordingly, a semi-rectangular shape includes ellipses, which form enclosed area that are not rectangular.

As used herein, an "elliptical" shape is defined as a curve on a plane surrounding two focal points such that the sum of the distances to the two focal points is constant for every point on the curve. An "elliptical" shape is defined to include a circle, which is a special type of ellipse, where both foci are at the same point. Additionally, although specific terms are employed herein, they are used in a generic and descriptive sense only and not for purposes of limitation.

What is claimed is:

1. A complementary metal-oxide-semiconductor (CMOS) image sensor, the CMOS image sensor comprising:
    a single mono-crystalline semiconductor substrate;
    a plurality of semiconductor slices formed on the single mono-crystalline semiconductor substrate, the plurality of semiconductor slices having a uniform width, the plurality of semiconductor slices being formed of different lengths and being arranged to form a semi-rectangular shape defining boundaries of the CMOS image sensor, each of the plurality of semiconductor slices being disposed proximate to another semiconductor slice of the plurality of semiconductor slices, the plurality of semiconductor slices being integrally connected on the single mono-crystalline semiconductor substrate,
    wherein each semiconductor slice of the plurality of semiconductor slices has a slice edge defining a side of the semiconductor slice, and wherein each semiconductor slice further comprises:
        a plurality of pixel arrays having an approximately uniform pixel pitch, each pixel array having rows and columns of pixels;
        a respective guard ring surrounding the plurality of pixel arrays;
        a respective seal ring enclosing the semiconductor slice; and a column of row-driver circuitry, wherein the column of row-driver circuitry is positioned proximate to the plurality of pixel arrays along a first side of the plurality of pixel arrays, wherein the seal rings of adjacent semiconductor slices are spaced apart from each other;

wherein the guard rings of adjacent semiconductor slices are spaced apart from each other;

wherein the guard ring, row-driver circuitry, slice edge, and seal ring of a first semiconductor slice among said plurality of semiconductor slices, and the seal ring, slice edge, and guard ring of a second semiconductor slice among said plurality of semiconductor slices being adjacent to said first semiconductor slice have a combined width such that a dead space between pixels of the first and second semiconductor slices is formed that corresponds to a single column of said pixels;

wherein the column of row-driver circuitry of each slice is arranged in between the seal ring and guard ring; and wherein a respective column of row-driver circuitry on each semiconductor slice of the plurality of semiconductor slices independently controls the plurality of pixel arrays of the respective semiconductor slice.

2. The CMOS image sensor of claim 1, wherein each semiconductor slice of the plurality of semiconductor slices further comprises a control and readout circuitry, wherein the control and readout circuitry is over a location that does not abut any pixel array of the plurality of pixel arrays of the semiconductor slice.

3. The CMOS image sensor of claim 1, further comprising:
 a printed circuit board disposed proximate to a backside of the CMOS image sensor; and
 a scintillator material disposed proximate to a front side of the CMOS image sensor.

4. The CMOS image sensor of claim 1, further comprising a printed circuit board and a scintillator material disposed proximate to a front side of the CMOS image sensor.

5. The CMOS image sensor of claim 1, wherein proximate semiconductor slices of the plurality of semiconductor slices are combined using a stitching technology.

6. The CMOS image sensor of claim 1, wherein the CMOS image sensor is an X-ray CMOS sensor.

7. The CMOS image sensor of claim 1, wherein each pixel array of the plurality of pixel arrays further comprises a plurality of pixels.

* * * * *